(12) United States Patent
Wang et al.

(10) Patent No.: US 7,032,827 B2
(45) Date of Patent: Apr. 25, 2006

(54) COMBINATION SD/MMC FLASH MEMORY CARD WITH THIRTEEN CONTACT PADS

(75) Inventors: Kuang-Yu Wang, Saratoga, CA (US); Jim Ni, San Jose, CA (US); Sun-Teck See, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 4 days.

(21) Appl. No.: 10/871,741

(22) Filed: Jun. 18, 2004

(65) Prior Publication Data

US 2005/0279838 A1 Dec. 22, 2005

(51) Int. Cl.
*G06K 19/06* (2006.01)

(52) U.S. Cl. .................... 235/492; 235/441

(58) Field of Classification Search ............. 235/492, 235/441, 487, 486, 380, 375, 475, 477, 479; 361/737; 439/326, 489
See application file for complete search history.

(56) References Cited

U.S. PATENT DOCUMENTS

| | | |
|---|---|---|
| 5,563,769 A | 10/1996 | MacGregor |
| 5,891,483 A | 4/1999 | Miyajima |
| 6,040,622 A | 3/2000 | Wallace |
| 6,102,743 A | 8/2000 | Haffenden et al. |
| 6,166,913 A | 12/2000 | Fun et al. |
| D445,096 S | 7/2001 | Wallace |
| D452,690 S | 1/2002 | Wallace et al. |
| D452,865 S | 1/2002 | Wallace et al. |
| D453,934 S | 2/2002 | Wallace et al. |
| 6,381,143 B1 | 4/2002 | Nakamura |
| 6,399,906 B1 | 6/2002 | Sato et al. |
| 6,410,355 B1 | 6/2002 | Wallace |
| 6,462,273 B1 | 10/2002 | Corisis et al. |
| 6,483,038 B1 | 11/2002 | Lee et al. |
| 6,527,188 B1 | 3/2003 | Shobara et al. |
| 6,580,615 B1 | 6/2003 | Nakanishi et al. |
| 6,624,005 B1 | 9/2003 | DiCaprio et al. |
| 6,634,561 B1 | 10/2003 | Wallace |
| 6,646,885 B1 | 11/2003 | Yu et al. |
| 6,768,645 B1 * | 7/2004 | Kadonaga .................... 361/737 |
| 2002/0055291 A1 * | 5/2002 | Maiterth et al. ............. 439/326 |
| 2002/0158646 A1 * | 10/2002 | DiFrancesco ................ 324/761 |
| 2004/0062112 A1 | 4/2004 | Nishizawa et al. |
| 2004/0066693 A1 | 4/2004 | Osako et al. |
| 2004/0070952 A1 | 4/2004 | Higuchi et al. |
| 2004/0084538 A1 | 5/2004 | Nishizawa et al. |
| 2004/0161965 A1 * | 8/2004 | Bricaud et al. .............. 439/489 |
| 2005/0120165 A1 * | 6/2005 | Liang .......................... 711/103 |

\* cited by examiner

*Primary Examiner*—Thien M. Le
(74) *Attorney, Agent, or Firm*—Bever, Hoffman & Harms, LLP; Patrick T. Bever

(57) ABSTRACT

A memory card including a PCB assembly that is consistent with existing 13-pad MMC mechanical form factors, and a housing that is consistent with the SD mechanical form factor, thereby providing a single PCBA and housing arrangement that can be used to produce both MMC and SD memory cards. The thirteen contact pads support all MMC and SD contact pad patterns, but are modified to facilitate a write protect switch. The housing includes an enlarged window (or windows) that exposes two or more contact pads in each of the multiple rows, thereby facilitating slidable insertion of the memory card into a socket of a host system. Alignment notches are formed in the side edges of the PCB, and/or alignment pins are utilized for properly aligning the PCBA within the housing.

10 Claims, 7 Drawing Sheets

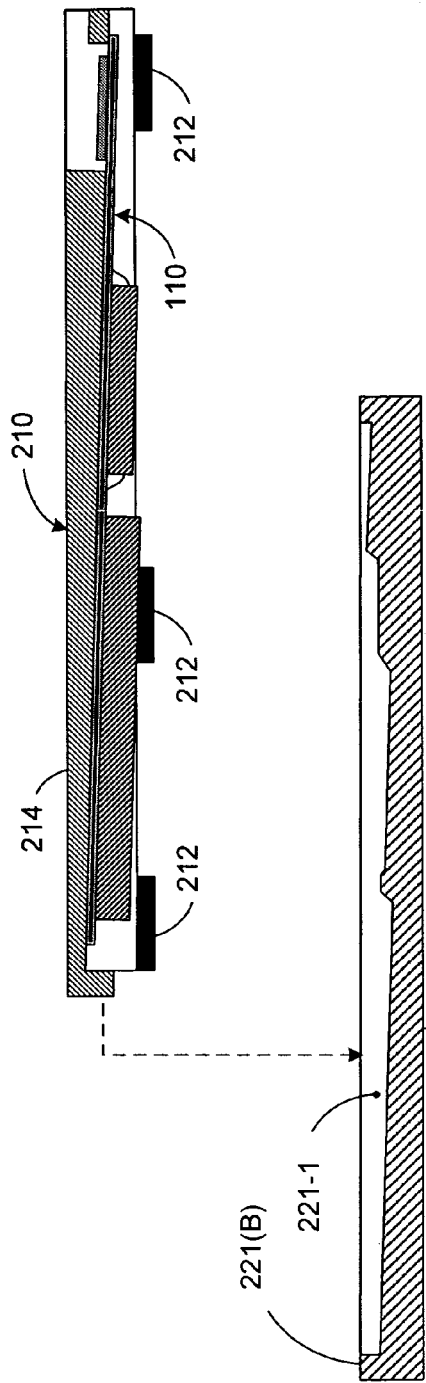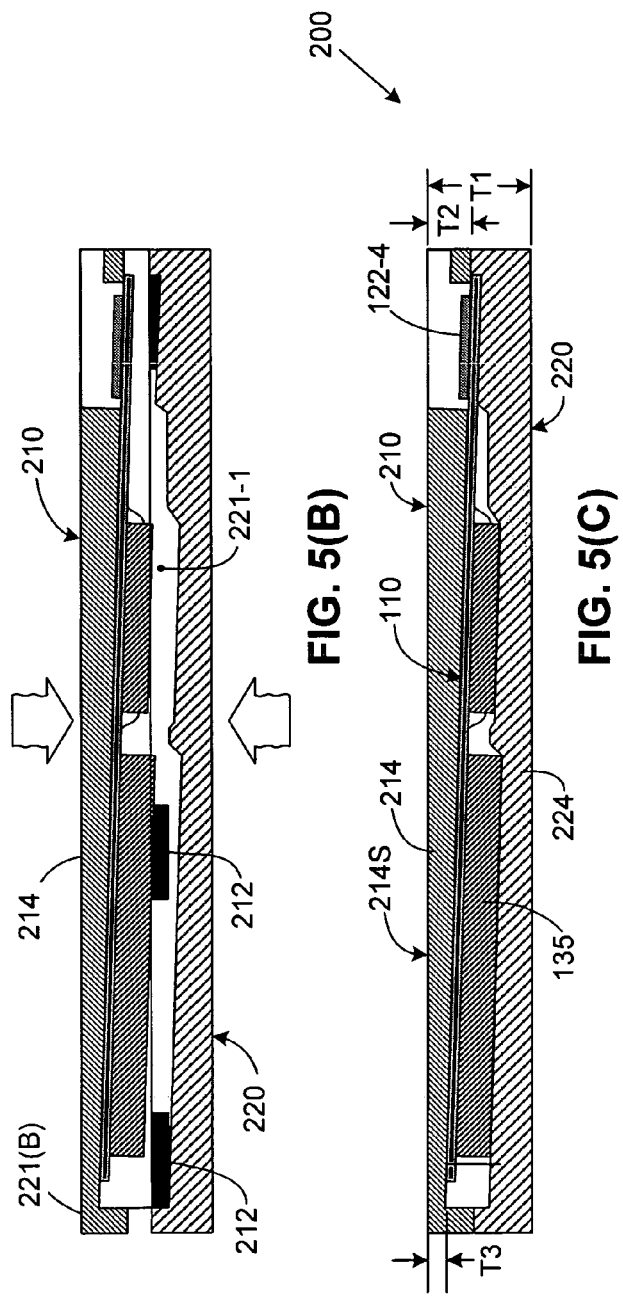

COMBINATION SD/MMC FLASH MEMORY CARD WITH THIRTEEN CONTACT PADS

BACKGROUND OF THE INVENTION

1. Field of the Invention

This invention relates to removable memory cards, and more particularly to removable memory cards for dual-protocol systems.

2. Related Art

Flash-memory cards are widely used for storing digital pictures captured by digital cameras. One useful format is the Secure-Digital (SD) format, which is an extension of the earlier MultiMediaCard (MMC) format. Such memory cards are also useful as add-on memory cards for other devices, such as portable music players, personal digital assistants (PDAs), and even notebook computers. SD cards are hot-swappable, allowing the user to easily insert and remove SD cards without rebooting or cycling power. Since the SD cards are small, durable, and removable, data files can easily be transported among electronic devices by being copied to an SD card. SD cards are not limited to flash-memory cards, but other applications such as communications transceivers can be implemented as SD cards.

SD and MMC are complementary card interfaces, and are sometimes lumped together and referred to as SD/MMC cards. Both SD and MMC cards are thin and the area they occupy is about that of a large postage stamp. Older "7-pad" MMC cards have 7 metal connector pads, while newer "9-pad" MMC cards and SD cards have 9 connector pads. MMC cards can fit in SD slots, but SD cards, which are packaged in about 50% thicker housings, cannot fit in MMC slots. In systems that accept either SD or MMC cards, the host socket must be sized to accept both card types, and also must have an operating system capable of determining which type of card is inserted into its socket, and capable of transmitting the necessary communication protocol needed to communicate with the inserted card. When a 7-pad MMC card is inserted, only seven contact pins of the socket are used for communication, while the additional two socket pins are used when a 9-pad MMC or SD card are detected in the slot.

The 9-pad SD interface currently supports a top transfer rate of 100 Mb/s, which is sufficient for many applications. However, some applications such as storage and transport of full-motion video could benefit from higher transfer rates. One limitation to the 9-pad form factor is that data is transferred in a parallel ×4-bit manner (i.e., four bits per transmission cycle).

One method to improve transmission speeds for SD and MMC cards is to facilitate ×8-bit data transmission by increasing the number of contact pads to thirteen. MMC recently announced its Specification Version 4.0, which introduced a two-row, thirteen contact pad arrangement and associated electronics. While the 13-pad arrangement introduced in the MMC 4.0 specification is generally backward compatible to earlier MMC and SD cards, the arrangement calls out enlarged contact areas that preclude the formation of a write protect switch utilized in SD cards. Accordingly, the MMC Specification Version 4.0 cannot be used to produce memory cards for systems that communicate with both SD and MMC card form factors. Accordingly, separate PCBAs are required to produce MMC and SD memory cards for such systems.

What is needed is a memory card assembly that can be used to produce both MMC and SD memory cards that can be used in an integrated SD/MMC system. In particular, what is needed is memory card assembly including a PCBA that is consistent with the existing 13-pad MMC mechanical form factor, and a housing that supports a write protection switch in manner consistent with existing SD form factors.

SUMMARY OF THE INVENTION

The present invention is directed to a 13-pad memory card including a printed circuit board assembly (PCBA) that is consistent with existing 13-pad MMC mechanical form factors, and a housing that is consistent with the SD mechanical form factor. In particular, the PCBA includes thirteen contact pads arranged in a pattern consistent with MMC Specification Version 4.0 mechanical form factors, and the housing includes both upper and lower covers that mount over the upper and lower surfaces of the PCBA. By packaging the MMC-compliant PCBA in the SD-type housing in the manner described herein, the present invention facilitates an efficient integrated SD/MMC host system that recognizes and communicates with memory cards operating on either SD or MMC electronic protocols. The present invention also facilitates the inexpensive production of both SD and/or MMC memory cards for the integrated SD/MMC host system because the PCBA and housing assembly can be utilized to produce cards of both types.

According to an embodiment of the present invention, the PCBA includes a printed circuit board (PCB) having a 13-pad contact pad array formed on an upper surface thereon, and one or more integrated circuits (e.g., a controller and a flash memory chip) mounted on a lower surface thereof. The thirteen contact pads of the array are arranged in a manner that complies with the MMC Specification Version 4.0 form factor, but includes at least one reduced-size contact pad to facilitate the inclusion of a write protect switch on the housing, which is needed to comply with the SD mechanical form factor. In particular, the elongated C8 contact pad of MMC Specification Version 4.0 is shortened such that its back end is aligned with the other contact pads arranged along the front edge of the PCBA. This shortened contact pad facilitates the formation of an alignment notch that mounts over a write protect switch mounting structure formed on the housing. During assembly, the write protect switch mounting structure is received inside the alignment notch, thereby maintaining the PCBA in a proper orientation inside the housing. An optional write protect switch is slidably inserted into the write protect switch structure (note that the slidable switch structure may be omitted in MMC versions of the memory card). Accordingly, a PCBA and housing assembly is provided that can be used to manufacture either SD or MMC memory cards (i.e., by mounting ICs that execute the corresponding SD or MMC protocol), thereby reducing manufacturing costs by avoiding the need to produce multiple housings and/or PCBAs.

In one embodiment, the PCBA is mounted in a housing including upper and lower covers that are joined at a seam that located inboard of one of the side walls. This internal joining beneficially prevents bonding material from overflowing to the exterior of the apparatus, and also minimizes the chances of misalignment between the upper and lower covers (and at the same time eliminating the need for high-precision alignment tooling for assembly). In addition, since the sides of the card-type electronic apparatus can be formed from just the sidewalls of the lower cover (rather than from a combination of sidewalls from both the upper and lower covers), control over the dimensional integrity of the apparatus can be more easily maintained.

In another embodiment, the interior surfaces of the housing covers are formed with a slight angle (i.e., such that the thickness of the cover gradually changes between the front and back edges of the housing), thereby maintaining the PCBA at an inclined angle relative to the outer cover surface (i.e., such that the exposed contact pads are tilted slightly down in the leading edge). The SD mechanical form factor requires that the contact pads be maintained at a specific distance (0.7 mm) from the top of the housing, and that the overall housing thickness is limited to 2.1 mm. Forming the housing such that the PCBA is maintained at a slightly angled orientation produces two benefits. First, by making the upper cover thinner near the trailing edge of the housing, the trailing edge of the PCBA can be raised relative to the front edge. As a result, a larger vertical space is provided inside the housing for the ICs (i.e., relative to a horizontal PCBA orientation), thereby allowing the use of relatively thick flash memory chips (e.g., a Thin Small Outline Package (TSOP) package with a thickness of 1.1 mm). Second, because the contact pads are slightly tiled, as the contact pads are received in a host socket, the tiled orientation will enable firm electrical contact between the contact pads and the contact pins of the host.

According to another aspect of the present invention, an enlarged window (or windows) are defined in the upper cover between a front wall of the frame to expose two or more contact pads in each of the multiple rows, thereby facilitating sliding insertion of the memory card into a socket of a host system. In one embodiment, several rails extend between multiple windows to stabilize the upper wall and to reduce the chance of contamination of the contact pads by touching. Various exemplary housing arrangements are disclosed, including the formation of a single window that eposes all of the multi-row contact pads (i.e., without the presence of stabilizing ribs. Because the larger exposure area can result in shifting of the PCB relative to the housing during and after assembly, one or more alignment structures are utilized to secure the PCB within the housing. In one embodiment, multiple grooves are formed along the side edges of the PCB that are mounted over corresponding structures formed along the inside surface of the housing. According to another embodiment, one or more central protrusions extend between the upper cover and the lower cover through corresponding alignment holes defined through the PCB.

The invention will be more fully understood in view of the following description of the exemplary embodiments and the drawings thereof.

BRIEF DESCRIPTION OF THE DRAWINGS

FIGS. 5(A), 5(B), and 5(C) are cross-sectional views of the memory card of FIG. 2, showing an assembly procedure according to another embodiment of the invention.

DETAILED DESCRIPTION

Figure 1:
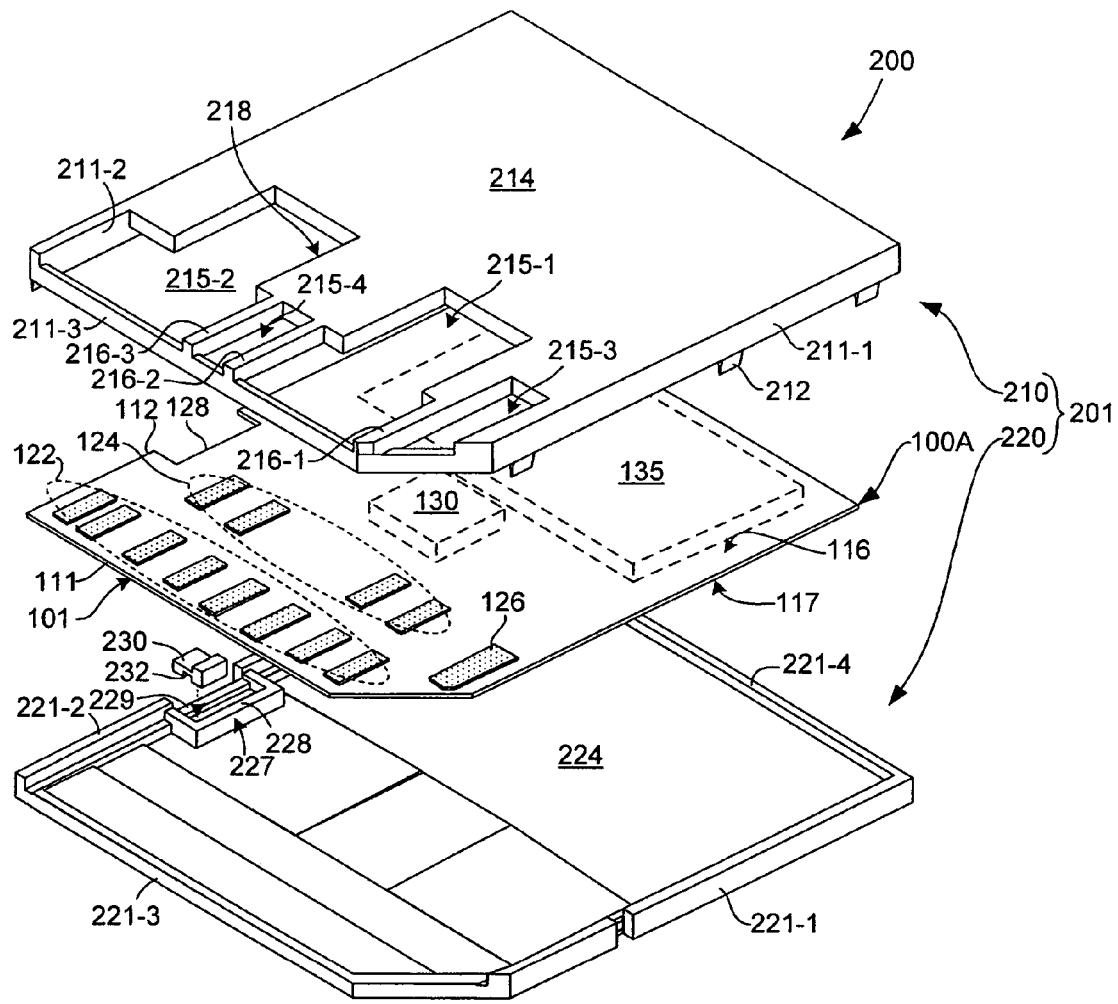
FIG. 1 is an exploded perspective view showing a multi-row memory card according to an embodiment of the present invention.
Figure 2:
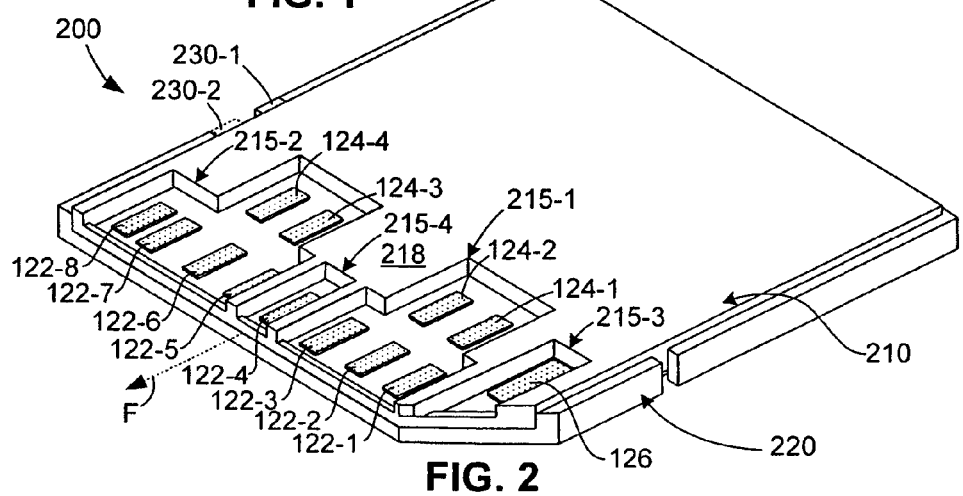
FIG. 2 is an assembled perspective view showing the multi-row memory card of FIG. 1.

FIGS. 1 and 2 are exploded perspective and assembled perspective views, respectively, showing a 13-pad memory card 200 according to an exemplary embodiment of the present invention. Memory card 200 generally includes a printed circuit board assembly (PCBA) 100A and a two-part housing 201 including an upper cover 210 and a lower cover 220 that are mounted over PCBA 100A in the manner shown in FIG. 2.

According to an aspect of the present invention, PCBA 100A is constructed in a manner that is consistent with MMC Specification Version 4.0 mechanical form factors, which were announced by MultiMediaCard (MMC) Association (www.mmca.org) in February 2004, and housing 201 is constructed in a manner that is consistent with mechanical form factors established by SD Card Association (www.sd-card.org). In particular, PCBA 100A includes thirteen contact pads arranged in a pattern consistent with MMC Specification Version 4.0, and housing 201 is formed with dimensions that comply with the SD form factor. By packaging PCBA 100A in SD-type housing 201 in the manner described below, the present invention facilitates an efficient integrated SD/MMC host system that recognizes and communicates with memory cards operating on either SD or MMC electronic protocols. In addition, the present invention also facilitates the inexpensive production of both SD and/or MMC memory cards for the integrated SD/MMC host system because the PCBA can be utilized to produce cards of both types.

Referring to FIG. 1, PCBA 100A includes a printed circuit board (PCB) 101 having thirteen contact pads formed on an upper surface 116 thereof, and one or more integrated circuits (ICs) 130 and 135 (indicated by dashed lines) mounted on a lower surface 117 thereof. As described in additional detail below, the thirteen contact pads are formed in an arrangement that is consistent with the MMC Specification Version 4.0 mechanical form factor. For explanatory purposes, the thirteen contact pads are generally designated as a first group 122 including eight contact pads (designated 122-1 through 122-8 in FIG. 2) aligned along a front edge 111 of PCB 101, a second group 124 including four contact pads (designated 124-1 through 124-4 in FIG. 2) arranged behind first group 122, and a thirteenth contact pad 126. As discussed in further detail below, although PCBA 100A is constructed in compliance with the MMC mechanical form factor (which is consistent with the 9-pad SD mechanical form factor), ICs 130 and 135 may be fabricated in accordance with either the SD or MMC communication protocols, thereby providing a single memory card structure that can be used to produce either SD or MMC memory cards.

Figure 3A:
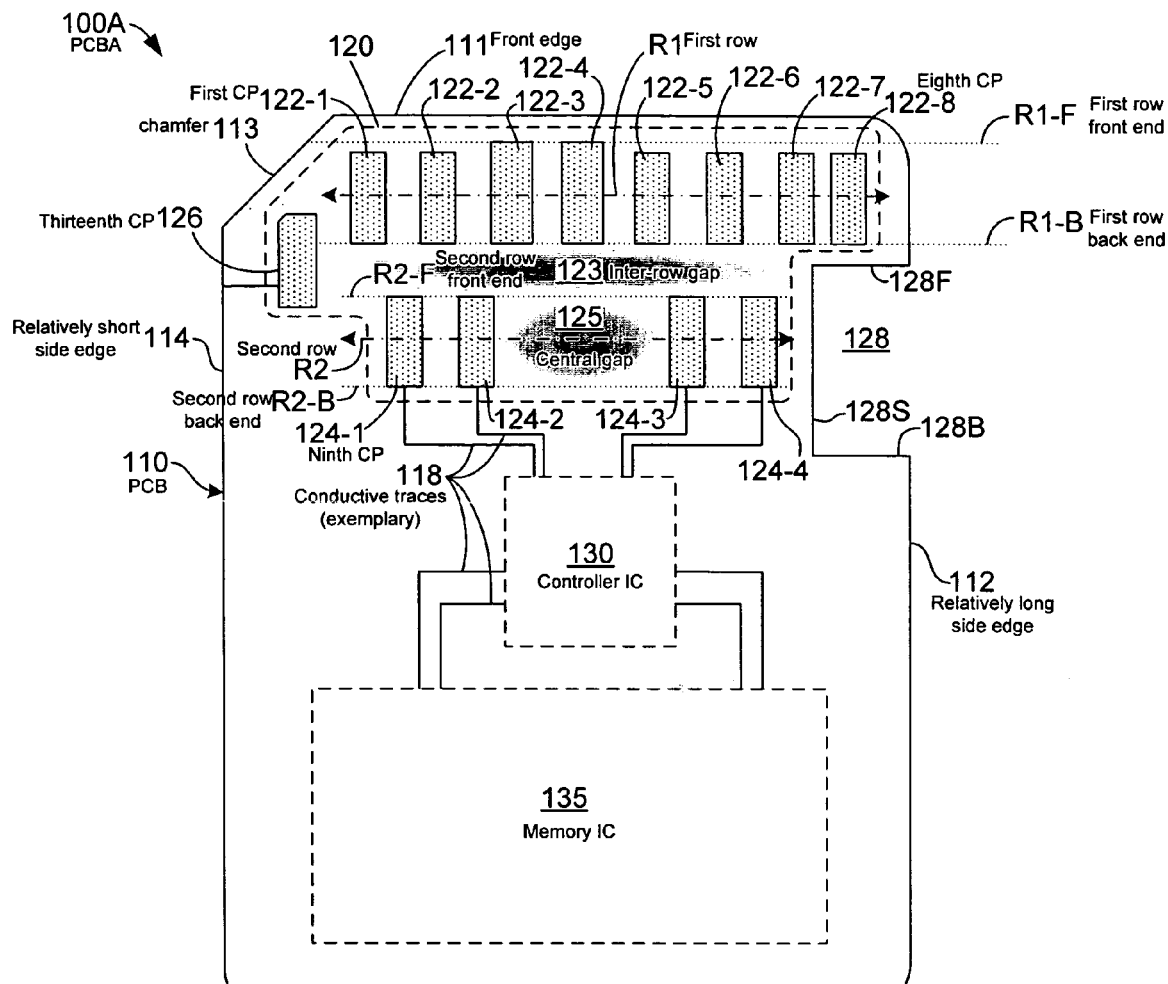
FIGS. 3(A) and 3(B) are top plan views showing printed circuit board assemblies (PCBAs) having two rows of contact pads according to an embodiment of the present invention.
Figure 3B:
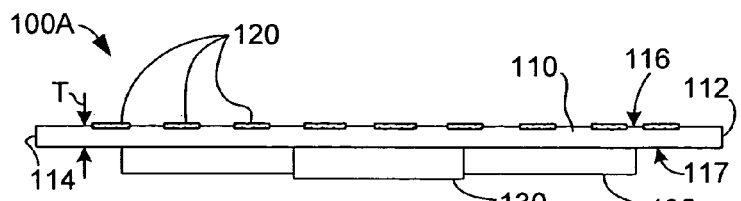

FIGS. 3(A) and 3(B) are top plan and end elevation views showing PCBA 100A in additional detail. PCBA 100A generally includes a printed circuit board 110 having a contact pad array 120 formed on its upper surface, and integrated circuits (ICs) 130 and 135 mounted on its lower surface. PCB 110 is formed in accordance with known PCB manufacturing techniques such that the contact pads of array 120 and ICs 130 and 135 (as well as other circuit components, which are omitted for brevity) are electrically interconnected by a predefined network of conductive traces 118 (only a few of which are shown for illustrative purposes).

According to both the MMC and SD mechanical form factors, PCB 110 is a substantially rectangular, flat substrate including multiple layers of conductive traces 118 and other conducting structures sandwiched between multiple layers of an insulating material (e.g., FR4) and adhesive. PCB 110 includes a front edge 111, a relatively long side edge 112, a relatively short side edge 114 located opposite to relatively long side edge 112, and a back edge 115. A chamfer (angled) edge 113 extends at approximately 45° between front edge 111 and shorter side edge 114. In one embodiment, PCB 110 has a length (i.e., measured from front edge 111 to back edge 115) designed to fit in a housing with 32 mm in length, a width (measured from longer side edge 112 to shorter side edge 114) designed to fit in the same housing with 24 mm in width, and a thickness T (measured from lower surface 116 to upper surface 117, as shown in FIG. 3(B)) of approximately 0.3 mm.

Referring to FIG. 3(A), contact pad array 120 includes first contact pad group 122 arranged to form a first row R1 that is parallel to front edge 111, second group 124 arranged to form a second row R2 that is parallel to first row R1, and thirteenth contact pad 126 that spans the first and second rows and is located adjacent to chamfer edge 113. First group 122 includes a first contact pad 122-1 that is located adjacent to an intersection of front edge 111 and chamfer edge 113, an eighth contact pad 122-8 that is located adjacent to longer side edge 112, and six intermediate contact pads 122-2, 122-3, 122-4, 122-5, 122-6 and 122-7 respectively arranged between first contact pad 122-1 and eighth contact pad 122-8. In one embodiment, contact pads 122-1, 122-2 and 122-5 through 122-8 define rectangular regions (elongated bodies) that are approximately 5 mm in length and 1.3 mm in width and contact pads 122-3 and 122-4 define slightly larger regions that are approximately 5.3 mm in length and approximately 1.7 mm in width. The majority of pads 124-1, 124-2, 124-3 and 124-4 should be able to fit into the space defined laterally by the edges between pads 122-1 and 122-2, 122-2 and 122-3, 122-5 and 122-6, and 122-6 and 122-7, respectively. The front ends of contact pads 122-1 through 122-8 (i.e., the ends closest to front edge 111) define a front end R1-F of first row R1, and the back ends of contact pads 122-1 through 122-8 (i.e., the ends furthest from front edge 111) define a back end R1-B of first row R1. Similarly, contact pads 124-1 through 124-4 of second row R2 define rectangular regions that are approximately 5 mm in length and 1.3 mm in width, the front ends of contact pads 124-1 through 124-4 define a front end R2-F of second row R2, and the back ends of contact pads 124-1 through 124-4 define a back end R2-B of second row R2. Respective spacings between adjacent contact pads of the first and second groups are approximately 1.5 mm (on average). Note that (ninth) contact pads 124-1 and (tenth) contact pad 124-2 form a first subgroup of second row R2, and (eleventh) contact pad 124-3 and (twelfth) contact pad 124-4 form a second subgroup of second row R2 that is spaced from the first subgroup by a relatively wide central gap 125 (i.e., approximately 6.6 mm). Note that the lengthwise (longitudinal) direction of all of the contact pads of array 120 is substantially perpendicular to front edge 111 of PCB 110.

As set forth in the following paragraphs, the PCB form factor and arrangement of contact pads of array 120 provide a substantial improvement over existing memory card specifications because array 120 facilitates the production of both SD and MMC memory cards, thereby facilitating electronic systems that accept and read both MMC and SD memory cards. In addition, array 120 facilitates the production of 13-pad MMC memory cards that utilize existing SD write protection apparatus to protect information written thereon, which is not possible using existing 13-pad MMC card form factors.

MultiMediaCard (MMC) Association (www.mmca.org) announced Specification Version 4.0 in February 2004 including a 13-pad arrangement. MMC Specification Version 4.0 features wider bus-width (×1 bit, ×4 bit, or ×8 bit), higher clock frequency with up to 20× faster transfer speed, and dual voltage operation enabling applications at lower power consumption by small mobile devices. Like PCBA 100, a memory card complying with MMC Specification version 4.0 includes thirteen metal contact pads (designated C1 through C13) formed in two rows on a PCB (substrate). The PCB of the MMC 4.0 specification is essentially identical to the form factor (i.e., length, width, thickness) described above with respect to PCB 110. The location of the contact pads according to the MMC 4.0 specification allows the card remains compatible with the older version MMC card standard (3.X) while providing additional contact pads in the second row to facilitate ×8 bit transmissions. For example, the 13 metal contact pads of the MMC 4.0 specification allow the memory card to communicate with a host device in "8 bit" set up for I/O transmission.

The specific positioning, shape and size of the thirteen contact pads associated with MMC Specification Version 4.0 is similar to the contact pad arrangement of array 120, with two notable differences. That is, the placement, size, and spacing of contact pads 122-1 through 122-7 and 124-1 through 124-4 of array 120 (shown in FIG. 3(A)) are essentially identical to corresponding contact pads of the Specification Version 4.0 (i.e., contact pads C1-C7 and C10-C13). In addition, eighth contact pad 122-8 and thirteenth contact pad 126 of array 120 correspond to portions of contact pads C8 and C9, respectively, of the MMC Specification Version 4.0 arrangement. However, contact pads C8 and C9 include extended body sections that are not utilized in contact pads 122-8 and 126 of array 120. In particular, a leading section of contact pad C8 (i.e., the portion generally aligned with the first contact pad row) corresponds to eighth contact pad 122-8, but contact pad C8 also includes a rear section that extends from the back end of the first (front) row to the back end of the second row. In addition, a leading section of contact pad C9 corresponds to thirteenth contact pad 126, but contact pad C9 also includes a rear section that extends from the back end of the leading section to the back end of the second row.

The present inventors have determined that only the leading portion of contact pads C8 and C9 of the MMC Specification Version 4.0 arrangement are necessary and desirable to facilitate access using a socket that is configured to access both MMC and SD memory cards. That is, for a system to accept and read both SD and MMC memory cards, the system would require a socket that (a) has a sufficiently large opening to accept the thicker SD form factor, (b) have contact pins capable of electrically connecting to the various pin arrangements provided on the SD and MMC memory cards, and (c) have a write protect detector positioned to detect the position of a write protect switch located on the longer side edge of standard SD housing. Taking advantage of requirement (a) (i.e., a socket large enough to accept SD memory cards), the present inventors propose an MMC memory card (described below) that is packaged in a housing based on the thicker SD form factor, although the thinner MMC form factor would certainly fit within such a socket. However, in meeting requirements (b) and (c), the present inventors have determined that the rear portions of contact pads C8 and C9 are undesirable because these portions are not consistent with the earlier form factors, because these portions unnecessarily take up valuable PCB surface area; and because the rear portion of contact pad C8 precludes the provision of a write protect switch. That is, only the leading (front) portions of contact pads C8 and C9 are consistent with corresponding contact pads of the MMC 9-pin form factor and the SD 9-pin form factor, so socket contact pins that access the rear portions would be either be incompatible with these previous form factors, or redundant (if provided in addition to pins that contact the front portions of these contact pads). Further, because the rear portion of contact pad C8 (MMC Specification Version 4.0) coincides with the position of the write protect switch detection apparatus used in SD systems, the inventors note that producing a socket that both supports write protect switch detection and includes a pin positioned to contact the rear section of contact pad C8 would be difficult and impractical. Accordingly, the present inventors determined that eliminating the rear section of contact pads C8 and C9 greatly facilitates the formation of a system that supports both SD and MMC memory cards. Thus, the novel contact pad arrangement of array 120 provides several benefits over previously established 13-pin contact pad arrangements.

Referring to the left side of FIG. 3(A), according to another aspect, thirteenth contact pad 126 is substantially rectangular (approximately 5.4 mm by 1.3 mm), and has a front end that is located between front end R1-F and back end R1-B of first row R1, and a back end that is located between front end R2-F and back end R2-B of second row R2. As mentioned above, the main benefit of thirteenth contact pad 126 over contact pad C9 of MMC Specification Version 4.0 is reduced area. Accordingly, in embodiments where this area reduction is not necessary, the larger, two-part contact pad C9 may be utilized in place of thirteenth contact pad 126.

Referring again to FIG. 3(A), according to a first aspect of the present invention, contact pad array 120 is characterized in that the eight contact pads 122-1 through 122-8 of the first group 122 are separated from the four contact pads 124-1 through 124-4 of second group 124 to by an elongated gap 123 (generally indicated by shaded region) that extends between the back ends of contact pads 122-1 through 122-8 and the front ends of 124-1 through 124-4. In particular, the back ends of contact pads 122-1 through 122-8 define back end (first straight) line R1-B of first row R1, and the front ends of contact pads 124-1 through 124-4 define front end (second straight) line R2-F, and elongated gap 123 is defined between back end line R1-B and front end line R2-F. The benefit of this arrangement is the provision that the back end of contact pad 122-8 is in general coincident with the back ends of contact pads 122-1 through 122-7, thereby facilitating the formation of a substantially rectangular alignment notch 128 in longer side edge 112 of PCB 110A in the region behind eighth contact pad 122-8 and to the right side of twelfth contact pad 124-4. In one embodiment, alignment notch 128 includes a front notch edge 128F and an opposing back notch edge 128B that extending substantially parallel to front edge 111 of PCB 110, and a side notch edge 128S that extends parallel to longer side edge 112. Front notch edge 128F is located between back end R1-B of first row R1 and front end R2-F of second row R2, and back notch edge 128B is located behind second row R2. Front notch edge 128F and back notch edge 128B have lengths selected such that at least a portion of eighth contact pad 122-8 is located between an area defined between the lengthwise extension of side notch edge 128S and longer side edge 112A. In one embodiment, front notch edge 128F and back notch edge 128B have lengths selected such that a portion of seventh contact pad 122-7 is located between an area defined between the lengthwise extensions of side notch edge 128S and longer side edge 112A. Note that one or more additional alignment notches may be provided along either side edge 112A and 114A of PCB 110A.

Referring back to FIG. 1, two-part housing 201 is connected together over PCBA 100A such that contact pads 122, 124 and 126 are exposed for coupling to a host system when memory card 200 is inserted into a socket (not shown) of the host system. Upper cover 210 includes a frame formed by linked peripheral walls (e.g., side walls 211-1 and 211-2, and front wall 211-3), several connection structures (e.g., ultrasonic bonding structures) 212 extending downward from a lower edge of at least some of these peripheral walls, and a planar upper wall 214 supported on upper edges of the peripheral walls. Similarly, lower cover 220 includes a frame including side peripheral walls 221-1 and 221-2, front wall 221-3 and back wall 221-4, and a planar lower wall 224 supported on lower edges of these peripheral walls. As described in additional detail below, when connected together in the manner depicted in FIG. 2, peripheral walls 211-1 and 211-2 of upper cover 210 are received inside peripheral walls 221-1 and 221-2 of lower cover 220, and connection structures 212 are melted or otherwise used to secure the two covers together. In an alternative embodiment (not shown) upper cover 210 may include a step-like geometry that extends over peripheral walls 221 of lower cover 220 (which are shorter in height), and the connection structures are located to secure the top edge of peripheral walls 221 to outer peripheral edges of upper cover 210.

According to an aspect of the present invention, housing 201 includes a write protect switch mounting structure 227 for slidably securing a write protect switch 230, and alignment notch 128 receives write protect switch mounting structure 227 when PCBA 100A is mounted inside housing 201. In particular, write protect switch mounting structure 227 includes a substantially rectangular raised wall 228 that extends onto lower wall 224, and a rail portion 229 that extends into a slot 232 of write protect switch 230 when write protect switch 230 is mounted onto lower cover 220. When PCBA 100A is mounted onto lower cover 220 during assembly, the end and side walls of alignment notch 128 tightly fit around raised wall 228, thereby providing self-alignment of PCBA 100A to lower cover 220. Write protect switch structure 230 is then optionally mounted onto write protect switch mounting structure 227 such that rail 229 is received in slot 232 (note that slidable switch structure 230 may be omitted in MMC versions of memory card 200). A corresponding structure (not shown) is provided on upper cover 210, whereby write protect switch 230 is secured to housing 201 when assembled. Thus secured, switch 230 is slidably between the two positions indicated by reference numerals 230-1 and 230-2 in FIG. 2. Accordingly, PCBA 100A and housing 201 can be used to manufacture either SD or MMC memory cards (i.e., by mounting ICs 130 and 135 that execute the corresponding SD or MMC protocol), thereby reducing manufacturing costs by avoiding the need to produce multiple housings and/or PCBAs.

According to another aspect of the invention, upper wall 214 of upper cover 210 defines at least one window through which at least two contact pads of first row 122 and at least two contact pads of second row 124 are exposed. That is, a window exposing two contact pads of first row 122 and two contact pads of second row 124 provides an efficient mechanism for establishing contact with the two rows of contact pads upon inserting the leading edge of memory card 200 into an associated socket (i.e., in the direction indicated by arrow F in FIG. 2). In the present embodiment, a first window 215-1 exposes contact pads 122-1 through 122-3 of the first row and contact pads 124-1 and 124-2 of the second row. Similarly, a second window 215-2 exposes contact pads 122-5 through 122-8 of the first row and contact pads 124-3 and 124-4 of the second row. In addition, cover 210 defines a third window 215-3 that exposes thirteenth contact pad 126, and a fourth window 215-4 that exposes contact pad 122-4. Note that a central cover section 218 extends from a front edge of upper wall 214 between windows 215-1 and 215-2, and several ribs 216-1 through 216-3 extend between adjacent windows to connect upper wall 214 (and/or central cover section 218) to front wall 211-3, thereby providing a rigid support for upper wall 214, and providing some protection for the various contact pads from contamination. In particular, a first rib 216-1 extends between a front edge of upper wall 214 and a first end of front wall 211-3 between windows 215-1 and 215-3, a second rib 216-2 extends between a front edge of central cover section 218 and front wall 211-3 between windows 215-1 and 215-4, and a third rib 216-3 extends between a front edge of central cover section 218 and front wall 211-3 between windows 215-2 and 215-4.

Figure 4A:
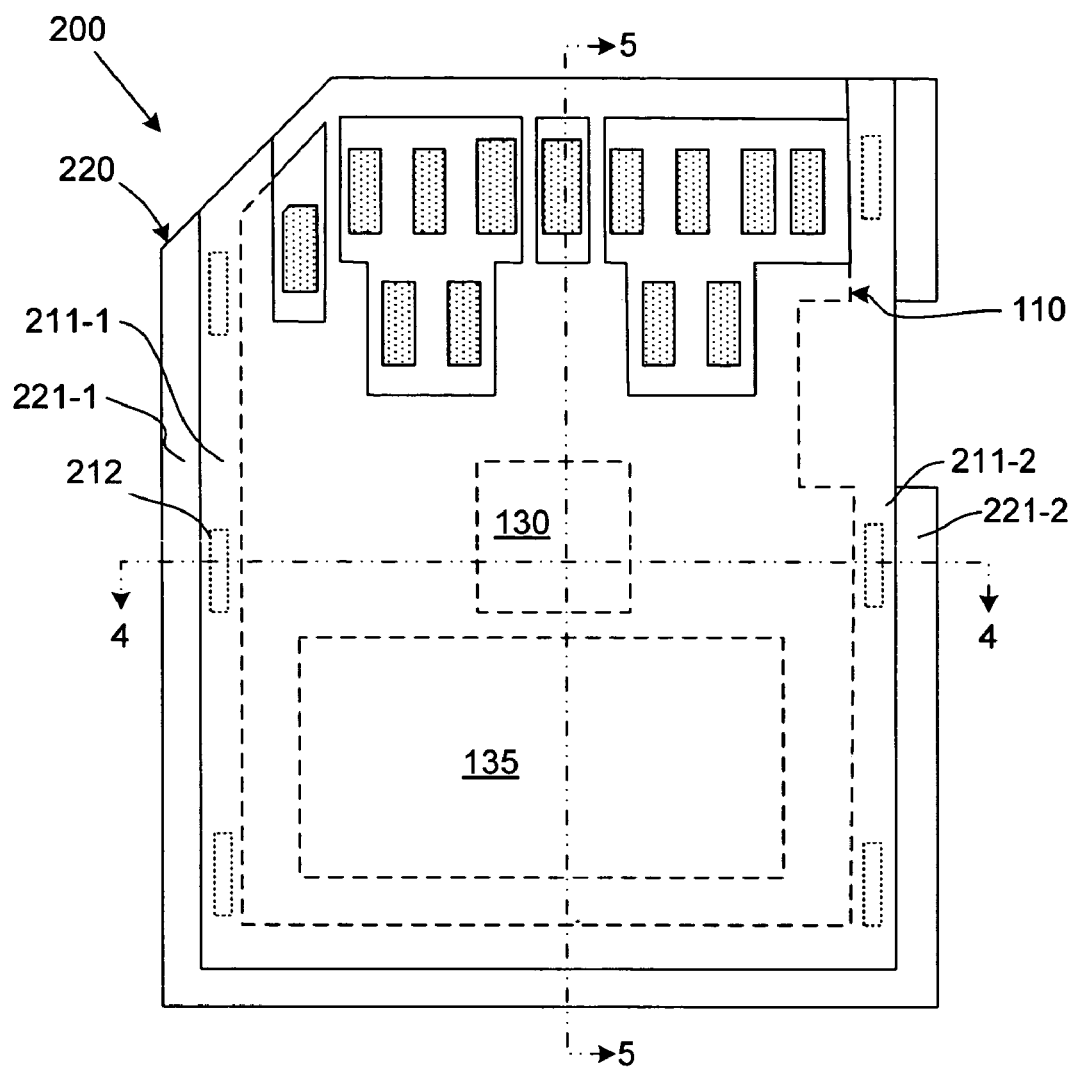
FIGS. 4(A) and 4(B) are plan and cross sectional end views of the assembled memory card shown in FIG. 2.
Figure 4B:
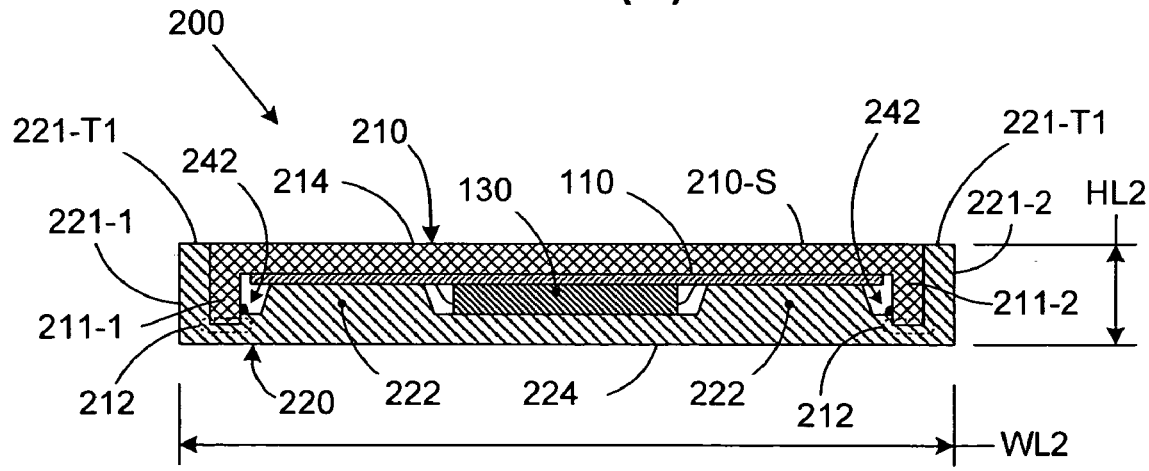

FIGS. 4(A) and 4(B) are top plan and cross-sectional side views, respectively, of one exemplary configuration showing memory card 200. FIG. 4(B) is taken along section line 4—4 of FIG. 4(A).

As depicted in FIG. 4(B), when upper cover 210 is mounted onto lower cover 220, side walls 211-1 and 211-2 of upper cover 210 are received inside of side walls 221-1 and 221-2 of lower cover 220 and multiple ultrasonic bonders 212 are attached to various locations on mating surfaces at the lower edge of side walls 211-1 and 211-2. According to an embodiment of the invention, lower wall 224 of lower cover 220 includes various interior support structures 222, which support unpopulated sections of PCB 110 to improve the structural rigidity and durability of assembled memory card 200.

During assembly, side walls 211-1 and 211-2 of upper cover 210 are inserted into side walls 221-1 and 221-2 (with bonders 212 being pressed into corresponding receiving features formed on lower cover 220), and a compressive (clamping) load is applied to force upper cover 210 towards lower cover 220 while ultrasonic vibrations are applied to bonders 212. In one embodiment, the bonding apparatus is modified to form a pocket over the main body of the device under assembly, thereby focusing the ultrasonic energy into the side walls and associated bonding structures. The ultrasonic vibrations cause bonders 212 to melt, thereby joining upper cover 210 with lower cover 220 to form the final card-type electronic apparatus 200, as shown in FIGS. 4(A) and 4(B). Because upper cover 210 "fits into" lower cover 220, the external form factor of memory card 200 can be controlled to a large degree by lower side walls 221-1 and 221-2. As shown in FIG. 4(B), the width WL2 of memory card 200 is defined by the external surfaces of sidewalls 221-1 and 221-2 of lower cover 220. Lower cover 220 can similarly define the length of memory card 200. Note also that while the top surface 210-S of upper cover 210 is positioned above a plane P2 defined by the top surfaces 221-T of lower sidewalls 221-1 and 221-2, according to another embodiment of the invention, top surface 210-S could be positioned at or below this plane.

Another benefit provided by positioning bonding features 212 inboard of sidewalls 221-1 and 221-2 is that sidewalls 221-1 and 222-2 provide alignment of upper cover 210 during assembly, and any bonder overflow 242 is contained within memory card 200, thereby preventing the overflow material from causing (external) dimensional problems. Note also that while the side walls 211 and 221 are depicted as having simple rectangular cross sections for exemplary purposes, any sidewall (and mating surface/feature) profile can be used that allows an internal seam to be formed.

It is noted that the upper/lower cover arrangement described with reference to FIGS. 4(A) and 4(B) is intended to be exemplary and not limiting. For example, novel aspects of the present invention may be incorporated into a housing structure in which upper cover 210 extends out over side walls 221-1 and 221-2 of lower cover 220, and a step-like connection arrangement is utilized to connect upper cover 210 to lower cover 220. Other cover arrangements in which side walls 211-1 and 211-2 engage or are otherwise connected to lower housing 220 may also be utilized.

FIGS. 5(A) to 5(C) are cross-sectional side views showing memory card 200 during assembly, with FIG. 5(C) showing the assembled memory card 200 (i.e., taken along cross-section 5—5 of FIG. 4(A)). Though not part of the cross-section, ultrasonic bonders 212 and lower sidewall 221-1 are shown for reference. FIG. 5(A) depicts upper cover 210 (with PCBA 110 installed) separated from lower cover 220. As indicated by the dashed arrow, upper cover 210 is placed next to the leading edge of lower cover 220. Upper cover 210 can then be slid into place over lower cover 220, with side walls 221-1 and 221-2 (not shown) acting as guides. Back wall 221(B) sets the end of travel for the slide operation. Once upper cover 210 is properly positioned over lower cover 220, as shown in FIG. 5(B), a clamping force is applied to covers 210 and 220, and ultrasonic energy is applied to bonders 212, as indicated by the large arrows. Bonders 212 melt under those bonding conditions, thereby joining upper cover 210 and lower cover 220 to form memory card 200, which is shown in FIG. 5(C). During the ultrasonic process, the upper cover 210 and lower cover 220 are enclosed in an upper die and a lower die (not shown) to maintain the card assembly 200 in position. Separate layers of protective film (not shown) can be placed between the upper die and upper cover, and between the lower die and lower cover to protect surface finish of the covers while the clamping force is applied and ultrasonic vibration is generated.

Referring to the right side of FIG. 5(C), the SD mechanical form factor requires that the overall thickness T1 of the housing be limited to 2.1 mm, and that the contact pads (e.g., contact pad 122-8) be maintained at a specific distance T2 of approximately 0.7 mm from top surface 214S. If PCB 110 were maintained in a horizontal orientation (per usual practice), this conventional arrangement leaves a space below PCB 110 of about 0.8 mm (assuming PCB 110 has a thickness of about 0.3 mm and lower wall 224 has a minimum thickness of 0.3 mm) for the ICs 130 and 135.

As indicated in FIG. 5(C), according to another aspect of the invention, the interior surfaces of upper wall 214 and lower wall 224 are formed with a slight angle (i.e., such that the thickness of upper cover 210 gradually changes from the relatively thick required thickness T2 near the front end to a relatively thin value T3 near the back end, and such that the thickness of lower cover 220 correspondingly changes from relatively thin near the front end to relatively thick near the back end). This inclined angle maintains PCB 110 at an inclined angle relative to the planar surface defined, for example, by upper surface 214S of upper wall 214. Because PCB 110 is planar (flat) due to its production by well-established PCB fabrication techniques, this inclined angle causes the exposed contact pads (e.g., contact pad 122-4, shown in FIG. 5(C)) to tilt slightly downward. This feature provides two main benefits. First, by forming the housing such that upper cover 210 is thinner near the trailing edge of the housing, the trailing edge of PCB 110 can be raised relative to the front edge. As a result, a larger vertical space is provided inside the housing for the ICs (i.e., in comparison to a horizontal PCBA orientation), thereby facilitating the use of relatively thick flash memory chips (e.g. TSOP with a thickness of 1.1 mm). Second, because the contact pads are slightly tilted, as the contact pads are better received in a host socket, and the tilted orientation will enable firm electrical contact between the contact pads and the contact pins of the host socket.

Figure 6:
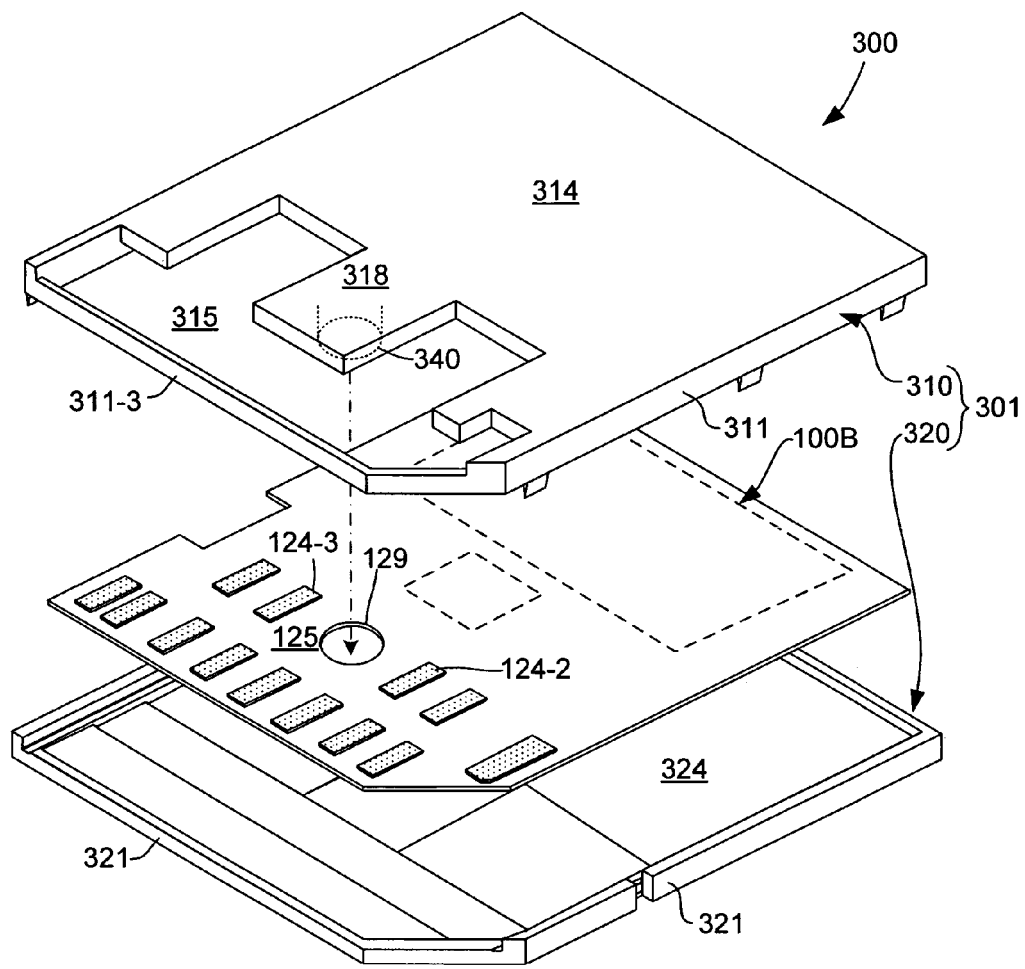
FIG. 6 is an exploded perspective view showing a multi-row memory card including a central positioning structure according to yet another embodiment of the present invention.

FIG. 6 is an exploded perspective view showing a memory card 300 including a PCBA 100B and a two-part housing 301 including an upper cover 310 and a lower cover 320. PCBA 100B is similar to PCB 100A (described above), but includes an alignment hole 129 located central gap 125 between contact pads 124-2 and 124-3. Similar to housing 201 (described above), upper cover 310 includes a peripheral wall 311 and a planar upper wall 314 supported on peripheral wall 311, and lower cover 320 includes a peripheral wall 321 and a planar lower wall 324 supported on peripheral wall 321. Upper wall 314 defines a single window 315 that exposes all of the contact pads provided on PCB 10B. Upper cover 310 and lower cover 320 connect together in a manner similar to that described above. However, because upper cover 310 does not include ribs extending between a front portion 311-3 of peripheral wall 311 and planar upper wall 314 (as in the previous embodiment), upper wall 314 may be less rigid than desired, particularly in the region of central cover section 318.

In accordance with another aspect of the present invention, upper cover 310 and/or lower cover 320 include an alignment pin 340 that extends through alignment hole 129 of PCBA 100B, thereby connecting upper wall 314 to lower body 324 to provide a rigid connection between upper cover 310 and lower cover 320. In particular, alignment pin 340 extends downward from central cover section 318 through alignment hole 129 to rigidly secure this structure to lower cover 320. Note that alignment pin 340 and alignment hole 129 may be positioned in a location other than that indicated in FIG. 6 (e.g., behind central cover section 318), and/or that one or more additional alignment pins/holes may be provided as needed to achieve the desired rigidity. Note that one or more alignment features similar to 340 may be provided to assemblies illustrated in FIG. 5 or FIG. 7(A) or 7(B).

Figure 7A:
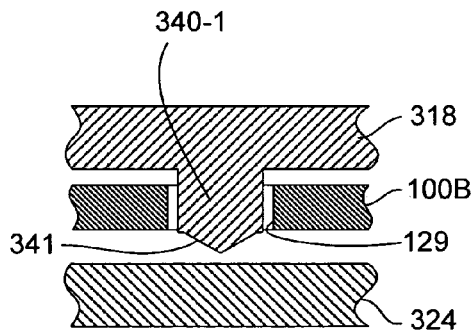
FIGS. 7(A) and 7(B) are partial cross-sectional side views showing the positioning structure of FIG. 6 according to alternative embodiments.
Figure 7B:
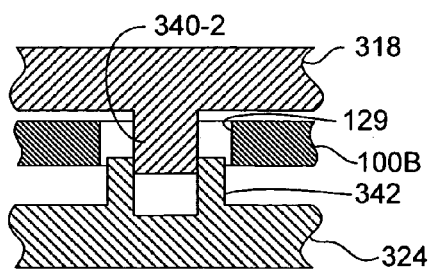

FIGS. 7(A) and 7(B) are cross-sectional side views showing exemplary alignment pin structures according to alternative embodiments of the present invention. As indicated in FIG. 7(A), in one exemplary embodiment, an alignment pin 340-1 extends downward from central cover section 318 and is inserted through alignment hole 129 of PCBA 100B, and includes an ultrasonic bonding structure 341 that is secured to lower wall 324 during assembly. As indicated in FIG. 7(B), in another exemplary embodiment, an alignment pin 340-2 extends downward from central cover section 318, and lower wall 324 includes a receiving structure 342 that receives the lower end of alignment pin 340-2, which can then be secured by press-fit, adhesive, ultrasonic bonding, or another known mechanism. The examples shown in FIGS. 7(A) and 7(B) are not intended to be limiting.

Figure 8:
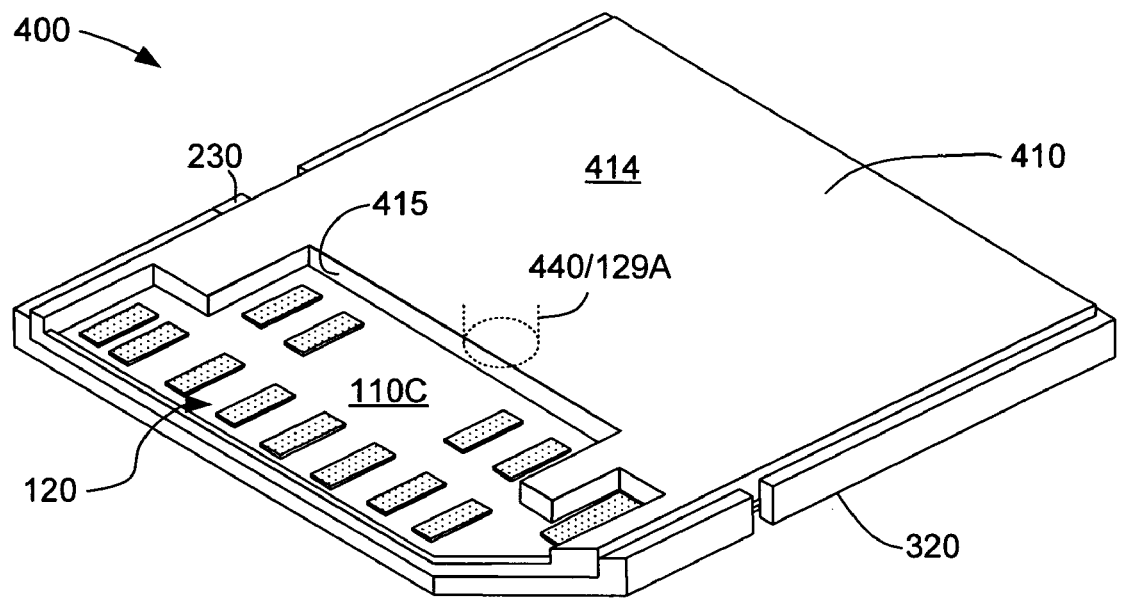
FIG. 8 is a perspective view showing a multi-row memory card according to yet another embodiment of the present invention.

FIG. 8 is perspective view showing a memory card 400 according to another specific embodiment of the present invention. Memory card 400 utilizes a housing formed by lower cover 320 (introduced above) and an upper cover 410 that defines a single window 415 exposing all thirteen contact pads of contact pad array 120. However, upper cover 410 differs from upper cover 310 (FIG. 6) in that central cover section 318, thereby eliminating the possibility that this section can be snagged or otherwise subjected to damage. Note, however, that PCB 110C of memory card 400 may define an alignment hole 129A that receives an alignment pin 440 in the manner described above to provide rigid support for upper wall 414.

Figure 9:
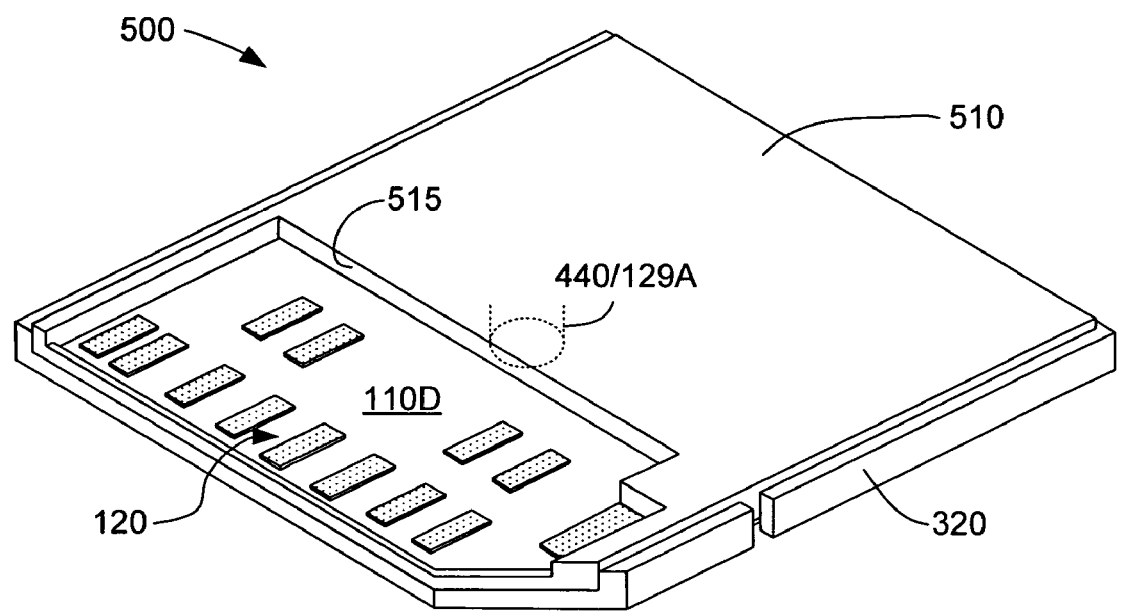
FIG. 9 is a perspective view showing a multi-row memory card according to yet another embodiment of the present invention.
Figure 10A:
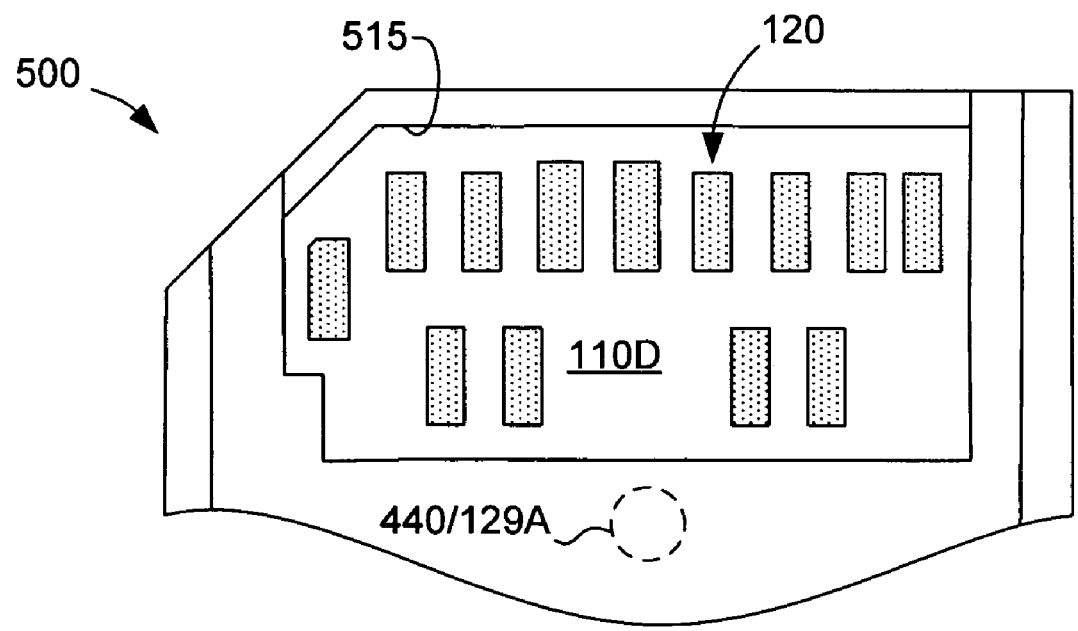
FIGS. 10(A) and 10(B) are top views showing the multi-row memory card of FIG. 9 with alternative multi-row contact pad arrangements.
Figure 10B:
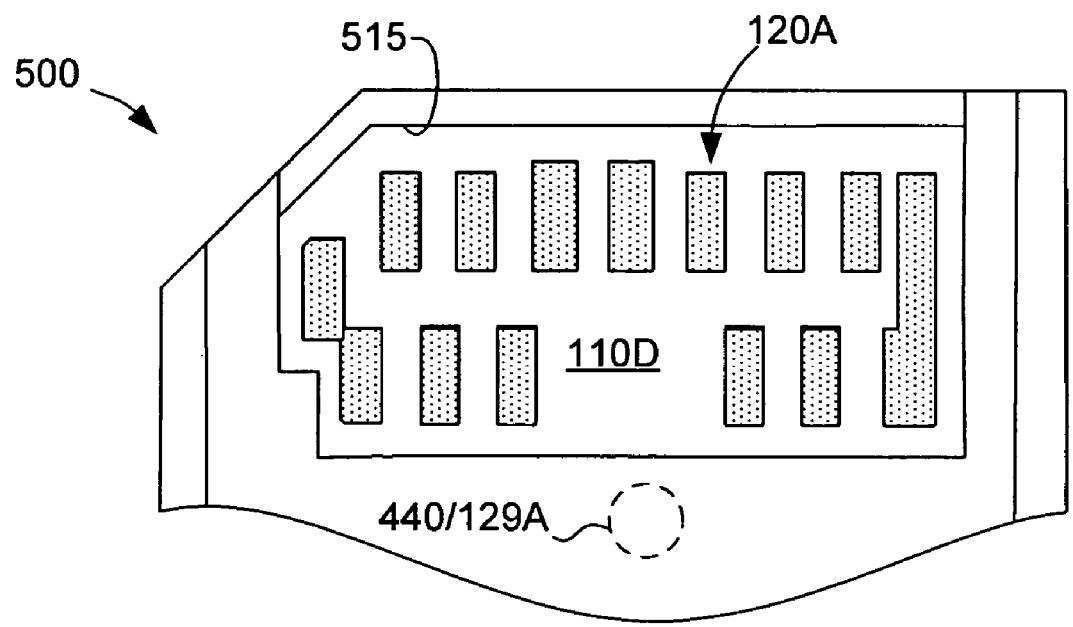

Although the present invention has been described with reference to memory card structures that can be utilized to produce both MMC and SD memory cards, certain novel characteristics of the present invention may be utilized to produce memory card structures that are not necessarily compliant with both standards. For example, FIG. 9 illustrates a memory card 500 housed in a two part housing that utilizes one or more of the inclined PCB arrangement described above with reference to FIG. 5(C), and the alignment pin/alignment hole arrangement described above with reference to FIGS. 6 and 8. Note that card 500 does not provide a structure for supporting a write protect switch, so opening 515 can be designed with more flexibility than window 415 (discussed above with reference to FIG. 8), and PCB 110D need not provide an alignment notch of the size described above. As indicated in FIGS. 10(A) and 10(B), by utilizing upper cover 510 with larger window 515, memory card 500 is able to support either the modified contact pad array 120 described herein (FIG. 10(A)), or the established MMC Specification Version 4.0 arrangement 120A, which is illustrated in FIG. 10(B).

The inventors also note that, to date, the MMC specification does not define write-protect hardware, and the data stored in a card with MMC form factor is subject to accidental removal, resulting in loss to personal or business applications. The integrated SD/MMC system described herein enables MMC functionalities in an SD mechanical form factor, thereby facilitating the efficient production of MMC cards with the write-protect feature previously available only on SD cards. Since the electrical-mechanical contact inside the integrated SD/MMC host device (not shown) for detecting the write-protect switch is already provided to support the SD protocol, the inventors propose a modified MMC protocol that communicates with this electrical-mechanical contact to facilitate a write-protected MMC card. As in the established SD protocol, the new MMC write-protect function is activated when the card is inserted and the write-protect switch in the card is set in a predetermined position (e.g., position 230-1, shown in FIG. 2).

The inventors also note that the present invention may also be utilized to efficiently produce a 13-pad memory card, with or without write-protect switch, to produce a new SD 8-bit I/O transmission protocol. The memory card configuration has the benefit of being backward compatible with existing 9-pin SD. Thus, a properly designed integrated SD/MMC host device equipped with 13-pin SD mechanical form factor will accept 13-pin SD, 13-pin MMC in SD form factor, 13-pin MMC in MMC form factor, 9-pin SD, 9-pin MMC in SD form factor, 9-pin MMC in MMC form factor and 7-pin MMC.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A memory card comprising:
a printed circuit board (PCB) including a front edge, a relatively long side edge, a relatively short side edge located opposite to the relatively long side edge, and a chamfer edge extending between front edge and the relatively short side edge;
a plurality of contact pads formed on a first surface of the PCB, the plurality of contact pads including a first row of contact pads and a second row of contact pads, the first row being aligned along the front edge of the PCB, and the second row being aligned parallel to the first row and positioned such that the first row is between the second row and the front end of the PCB; and
a two-part housing comprising:
an upper cover including an upper wall mounted over the upper surface of the PCB; and
a lower cover including a lower wall mounted over a bottom surface of the PCB, the lower cover being attached to the upper cover,
wherein the lower cover includes a switch mounting structure, and
wherein the relative long side edge of the PCB defines an alignment notch that receives the switch mounting structure when the PCB is mounted onto the two-part housing
wherein the first row includes eight substantially rectangular contact pads, each contact pad of the first group having a front end located adjacent to the front edge of the PCB, a back end, the first group including a first contact pad located at a first end of the first row adjacent to the chamfer edge, and an eighth contact pad located at a second end of the first row adjacent to the relatively long side edge,
wherein the second row includes four substantially rectangular contact pads arranged parallel to the first row, each contact pad of the second group having a front end and a back end, the second group including a ninth contact pad located at a first end of the second row adjacent to the chamfer edge, and a twelfth contact pad located at a second end of the first row adjacent to the relatively long side edge,
wherein the back ends of each contact pad of the first row define a first straight line,
wherein the front ends of each contact pad of the second row define a second straight line that is parallel to the first straight line, and
wherein an elongated gap is defined between the first and second straight lines.

2. The memory card according to claim 1, wherein the alignment notch includes a front notch edge located between first and second straight lines, and a side notch edge that is parallel to the relatively long side edge and aligned such that at least a portion of the eighth contact pad is positioned between the side notch edge and the relatively long side edge.

3. The memory card according to claim 2,
wherein the first row includes a seventh contact pad located adjacent to the eighth contact pad, and
wherein the side notch edge is aligned such that at least a portion of the seventh contact pad is located between a longitudinal extension of the side notch edge and the longer side edge.

4. A memory card comprising:
a printed circuit board (PCB) including a front edge, a relatively long side edge, a relatively short side edge located opposite to the relatively long side edge, and a chamfer edge extending between front edge and the relatively short side edge;
a plurality of contact pads formed on a first surface of the PCB, the plurality of contact pads including a first row of contact pads and a second row of contact pads, the first row being aligned along the front edge of the PCB, and the second row being aligned parallel to the first row and positioned such that the first row is between the second row and the front end of the PCB; and
a two-part housing comprising:
an upper cover including an upper wall mounted over the upper surface of the PCB; and
a lower cover including a lower wall mounted over a bottom surface of the PCB, the lower cover being attached to the upper cover,
wherein the lower cover includes a switch mounting structure,
wherein the relative long side edge of the PCB defines an alignment notch that receives the switch mounting structure when the PCB is mounted onto the two-part housing
wherein the upper cover defines at least one window exposing at least three contact pads of the first row and at least two contact pads of the second row, and
wherein the upper cover defines a first opening exposing at least three contact pads of the first row and at least two contact pads of the second row, and a second opening exposing at least three contact pads of the first row and at least two contact pads of the second row.

5. The memory card according to claim 4,
wherein the upper cover further defines a third opening exposing a thirteenth contact pad located adjacent to the chamfer edge, and
wherein the first window and the third window are separated by a first rib extending between the upper wall and a front wall of the upper cover.

6. The memory card according to claim 5,
wherein the upper cover further defines a fourth opening exposing a fourth contact pad of the front row, and
wherein the first window and the fourth window are separated by a second rib, and the second window and the fourth window are separated by a third rib.

7. The memory card according to claim 6, wherein the upper wall includes a central cover section extending from a front edge of the upper wall between the first and second windows, and wherein the second and third ribs extend between the central cover section and the front wall of the upper cover.

8. The memory card according to claim 1, wherein the second group further comprises a tenth contact pad and an eleventh contact pad, wherein a central gap is defined between the tenth and eleventh contact pads, and wherein an alignment hole is defined through the PCB in the general area of central gap.

9. The memory card according to claim 8, wherein the two-part housing further comprises an alignment pin extending through the alignment hole between the upper and lower covers.

10. The memory card according to claim 8, wherein the upper wall includes a central cover section extending from a front edge of the upper wall into the window over the central gap of the PCB, and wherein the alignment pin extends from the central cover section through the alignment hole.

\* \* \* \* \*